(12) United States Patent
Dinu

(10) Patent No.: US 11,463,034 B2
(45) Date of Patent: Oct. 4, 2022

(54) MOTOR DRIVE

(71) Applicant: Hamilton Sundstrand Corporation, Charlotte, NC (US)

(72) Inventor: Andrei Dinu, Solihull (GB)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 52 days.

(21) Appl. No.: 16/950,153

(22) Filed: Nov. 17, 2020

(65) Prior Publication Data
US 2021/0249979 A1 Aug. 12, 2021

(30) Foreign Application Priority Data

Feb. 12, 2020 (EP) ..................................... 20275040

(51) Int. Cl.
| | |
|---|---|
| *H02P 1/30* | (2006.01) |
| *H02P 1/52* | (2006.01) |
| *H02P 3/00* | (2006.01) |
| *H02P 21/13* | (2006.01) |
| *H02P 21/22* | (2016.01) |
| *H02P 27/12* | (2006.01) |
| *H03H 7/01* | (2006.01) |

(52) U.S. Cl.
CPC .............. *H02P 21/13* (2013.01); *H02P 21/22* (2016.02); *H02P 27/12* (2013.01); *H03H 7/0115* (2013.01); *H02P 2201/03* (2013.01); *H03H 2007/013* (2013.01)

(58) Field of Classification Search
CPC ................................. H02P 27/12; H02P 21/22

USPC .......................................................... 318/503
See application file for complete search history.

(56) References Cited

U.S. PATENT DOCUMENTS

| | | |
|---|---|---|
| 3,943,439 A | 3/1976 | Raymond |
| 6,697,270 B1 | 2/2004 | Kalman et al. |
| (Continued) | | |

FOREIGN PATENT DOCUMENTS

| | | |
|---|---|---|
| EP | 2765428 B1 | 9/2019 |
| WO | 2019127184 A1 | 7/2019 |

OTHER PUBLICATIONS

European Search Report for Application No. 20275040.2, dated Oct. 21, 2020, 11 pages.

*Primary Examiner* — Erick D Glass
(74) *Attorney, Agent, or Firm* — Cantor Colburn LLP

(57) ABSTRACT

A motor drive comprises a rectifier circuit portion arranged to receive an externally supplied AC voltage and to generate a DC bus voltage. An inverter circuit portion is arranged to receive the DC bus voltage ($V_{DC\_Bus}$) and to generate an AC output voltage ($V_{out}$) for supply to an external load. A DC bus portion is connected between the rectifier and the inverter. An inductor ($L_1$) is connected in series along a bus conductor between the rectifier and inverter, and a DC link capacitor ($C_1$) is connected in parallel between the bus conductors. A voltage across the DC link capacitor ($C_1$) is input to a tuneable notch filter arranged to supply a filtered signal. A controller varies the resonant frequency of the notch filter to a plurality of values across an operational range and modulates a supply current provided by the inverter with a probe current signal at the resonant frequency.

15 Claims, 11 Drawing Sheets

(56) References Cited

U.S. PATENT DOCUMENTS

| | | | |
|---|---|---|---|
| 9,564,039 B2* | 2/2017 | Hermann | G08B 21/245 |
| 2011/0038185 A1* | 2/2011 | Swamy | H02J 7/04 |
| | | | 363/95 |
| 2014/0225545 A1* | 8/2014 | Becerra | H02P 6/14 |
| | | | 318/400.26 |
| 2014/0369091 A1 | 12/2014 | Bauer et al. | |
| 2015/0092460 A1 | 4/2015 | Tallam et al. | |
| 2018/0262144 A1* | 9/2018 | Miklosovic | H02P 23/14 |

* cited by examiner

MOTOR DRIVE

FOREIGN PRIORITY

This application claims priority to European Patent Application No. 20275040.2 filed Feb. 12, 2020, the entire contents of which is incorporated herein by reference.

TECHNICAL FIELD

This disclosure relates to a motor drive arranged to monitor degradation of an internal capacitor, in particular the capacitance of a DC link capacitor of the motor drive.

BACKGROUND ART

Typical industrial motor drives include a front-end rectifier arranged to convert an externally supplied AC voltage to a rectified DC voltage, and a power inverter that converts this rectified DC voltage to an AC voltage suitable for supply to a motor. The motor may, in turn, drive an actuator. Such motor drives are used in a wide variety of applications, however some such motor drives are particularly applicable to aerospace applications.

The front-end rectifier and the power inverter are generally separated by a DC bus, where the DC bus includes a DC link capacitor. The DC link capacitor is typically connected in parallel between the positive and negative conductors of the DC bus and serves to smooth the DC voltage output of the front-end rectifier. The DC link capacitor also protects upstream circuits from the transient response of downstream circuits.

Typically, the DC link capacitor value is selected to optimise the stability of the DC voltage across the bus. However, the capacitance of the DC link capacitor can change over time. One cause of this change in capacitance is a slow aging mechanism which leads to the capacitance decreasing by a few percentage points over a relatively long period of time, e.g. over a few years. A further cause is a failure mechanism involving dielectric breakdown followed by capacitor self-healing, which can cause sudden and significant drops in the capacitance.

In motor drives for aerospace applications, the weight and volume of the motor drive is an important consideration, where the weight and volume are ideally minimal. The DC link capacitor is generally one of the largest components of the motor drive by volume. In order to minimise weight and volume, the minimal capacitance component possible is typically selected, however this generally means that there is little overvoltage margin and little current ripple margin in the design which makes premature aging of the device more likely.

The present disclosure is concerned with providing an improved motor drive capable of detecting capacitance changes such that replacement or maintenance can be carried out at the appropriate time while allowing the use of a physically small and/or lightweight DC link capacitor.

SUMMARY OF THE DISCLOSURE

In accordance with a first aspect, the present disclosure provides a motor drive comprising: a rectifier circuit portion arranged to receive an externally supplied AC voltage and to generate a DC bus voltage therefrom; an inverter circuit portion arranged to receive the DC bus voltage and to generate an AC output voltage therefrom for supply to an external load; a DC bus portion connected between said rectifier and inverter circuit portions, said DC bus portion comprising first and second conductors, wherein an inductor is connected in series along the first conductor between said rectifier and inverter circuit portions, and wherein a DC link capacitor is connected in parallel between the first and second conductors; a notch filter having a tuneable resonant frequency, wherein a voltage across the DC link capacitor is input to the notch filter, the notch filter being arranged to supply a filtered signal; and a controller arranged to vary the resonant frequency of the notch filter and to modulate a supply current provided by the inverter circuit portion with a probe current signal at the resonant frequency; wherein the controller is arranged to vary the resonant frequency to a plurality of values across an operational range, to measure an amplitude of the filtered signal, to determine which of the plurality of values of the resonant frequency has a maximal amplitude of the filtered signal associated therewith, and to determine a capacitance value of the DC link capacitor from said value of the resonant frequency associated with the maximal amplitude.

The first aspect of the disclosure extends to a method of monitoring degradation of a capacitor of a motor drive, the method comprising: exciting a DC bus with a current controlled by a power inverter; determining a shift in a natural frequency of a resonator on the DC bus, said resonator comprising an inductor and the capacitor; and attributing the shift in natural frequency to a change in a capacitance of the capacitor being outside of a selected threshold range of capacitance values. In some examples, the method of monitoring degradation of the capacitor of a motor drive without using any additional components of the motor drive than those already present. The current controller by the power inverter is, at least in some examples, a low amplitude current.

This first aspect of the disclosure extends to a method of operating a motor drive comprising: a rectifier circuit portion and an inverter circuit portion having a DC bus portion connected therebetween, said DC bus portion comprising first and second conductors, wherein an inductor is connected in series along the first conductor between said rectifier and inverter circuit portions, and wherein a DC link capacitor is connected in parallel between the first and second conductors; and a notch filter having a tuneable resonant frequency, wherein a voltage across the DC link capacitor is input to the notch filter, the notch filter being arranged to supply a filtered signal; wherein the method comprises: receiving an externally supplied AC voltage and to generate a DC bus voltage therefrom using the rectifier circuit portion; receiving the DC bus voltage and generating an AC output voltage therefrom using the inverter circuit portion; supplying the AC output voltage to an external load; varying the resonant frequency of the notch frequency; modulating a supply current provided by the inverter circuit portion with a probe current signal at the resonant frequency; varying the resonant frequency to a plurality of values across an operational range; measuring an amplitude of the filtered signal; determining which of the plurality of values of the resonant frequency has a maximal amplitude of the filtered signal associated therewith; and determining a capacitance value of the DC link capacitor from said value of the resonant frequency associated with the maximal amplitude.

Thus it will be appreciated that aspects of the present disclosure provide an improved motor drive system and method of operating the same in which the capacitance of the DC link capacitor is determined by performing a frequency sweep to probe the resonant frequency of the effective resonant circuit constructed from the inductor and DC link capacitor, often referred to in the art as an 'LC resonant circuit' or 'LC resonator'.

It will be appreciated that the notch filter may not actually be constructed from discrete physical components, and may be implemented using logical function blocks, e.g. those already present in a conventional motor drive, e.g. logical function blocks of an existing controller, e.g. the controller that is arranged to vary the resonant frequency of the notch filter. Other components of the motor drive system may similarly be implemented using logical function blocks rather than discrete hardware as appropriate.

By augmenting the current supplied to the inverter downstream of the LC resonator, the voltage across the DC link capacitor (which would otherwise have simply been a relatively steady-state DC voltage) is provided with a 'small signal' (i.e. AC) component. By varying the frequency of this AC component, the magnitude of the voltage across the DC link capacitor can be observed to determine the approximate resonant frequency of the LC resonator, which in turn provides a measure of the capacitance of the DC link capacitor as outlined in further detail below.

In general, the inductor is already present in the DC bus of conventional motor drives known in the art per se. Thus, advantageously no additional hardware is required in order to form the LC resonator. The inductor itself is generally a fixed component, the inductance of which does not generally vary over time.

As the inductor and DC link capacitor form an LC resonator, the resonant frequency of the LC resonator is expressed as per Equation 1 below:

$$f_{res} = \frac{1}{2\pi\sqrt{LC}} \quad \text{Equation 1}$$

Resonant frequency of an LC resonator where $f_{res}$ is the resonant frequency of the LC resonator, L is the inductance of the inductor, and C is the capacitance of the DC link capacitor.

By sweeping through a number of different candidate frequency values across the operational range and selecting the value leading to the largest amplitude at the output of the notch filter, an approximation of the resonant frequency $f_{res}$ of the LC resonator can be determined. Additionally, because the inductance L of the inductor is known, the capacitance C of the DC link capacitor may be determined by rearranging Equation 1 as per Equation 2 below:

$$C = \left(\frac{1}{2\pi f \sqrt{L}}\right)^2 \quad \text{Equation 2}$$

Capacitance of the DC link capacitor within an LC resonator

The typical motor phase currents may vary between approximately 1 A and 100 A, depending on the exact nature of the application, e.g. electromechanical actuators, fans, pumps, thrust reversers, electric brakes etc. The frequency of the phase currents is, in general, proportional to the speed of the motor. In a typical application, the frequency increases from 0 Hz when the motor starts spinning and can reach up to approximately 1 kHz, depending on the top speed and construction of the motor. The amplitude of the motor phase voltage is generally dependent on the motor current and the motor speed. Typically, the amplitude increases from just a few volts at zero speed to potentially several hundred volts at top speed. The inverter ideally supplies power with the correct voltage amplitude and frequency to the motor, where the motor current is dictated by Ohm's law. The voltage demand may be calculated by a digital motor controller based on the required motor current which, in turn, may depend on the motor speed error, i.e. a difference between a reference speed and an actual measured speed of the motor.

The DC link passive components—e.g. the capacitor and inductor(s)—may be selected such that the resonant frequency is above the maximum frequency of the motor phase currents and voltages. The resulting resonant frequency may therefore be somewhere between the top motor phase voltage frequency and the inverter PWM frequency, and may for example be between approximately 1 kHz and 10 kHz.

The probe current signal referred to hereinabove may be a 'current demand' with frequency in the order of approximately a few kHz but with a relatively low amplitude (e.g. below approximately 1 A). This current demand may be translated into an appropriate voltage demand by the controller (e.g. a digital motor controller). This may then be PWM modulated and applied to the inverter power transistors. Compared to conventional arrangements known in the art per se, the probe current signal has a relatively low amplitude but relatively high frequency, whereas 'normal' motor control signals generally have much higher amplitude and much lower frequency.

The controller may carry out the test of the capacitance value of the DC link capacitor at any time, however for simplicity it may be advantageous to carry out the tests when the external load is idle, e.g. if a motor connected downstream of the inverter is idle or powered off. In some examples, the controller performs the frequency sweep to determine the capacitance value during a start-up procedure of the motor drive. The 'front-end' rectifier may not allow the current on the DC link to change polarity during the resonant LC operation mode. As such, resonance can only take place if there is a minimum level of dc current on the DC link, such that the total current (i.e. the dc 'steady state' component plus the resonant component) does not cross zero. This condition may be achieved during what is known as 'pre-charge' of the DC link. Those skilled in the art will appreciate that this is the time between the initial connection to the external power supply and the time when the DC link capacitor has reached its nominal voltage. The pre-charge current typically ramps up rapidly from zero to a peak value dependent on the size of a pre-charge resistor and then it decays exponentially back to zero. In some examples, the capacitor test can be performed during the exponential decay of the pre-charge current. Thus, in accordance with examples of the present disclosure, the controller provides a 'Power-up Built-In Test' (PBIT) mechanism.

If the determined capacitance of the DC link capacitor has strayed from its intended value, e.g. by more than a threshold amount which may be set in accordance with an acceptable tolerance, in some examples an alert may be raised by the controller. This alert may therefore be raised if the instantaneous capacitance value at the time of measurement is sufficiently far removed from the acceptable capacitance value. The alert may simply comprise a warning flag (e.g. a register value may be toggled from '0' to '1'), however in some examples the alert may comprise further information regarding the capacitance degradation, e.g. the most recently determined value of the capacitance of the DC link capacitor and/or a rate of change of the capacitance as outlined below.

The first and second conductors may, at least in some examples, be positive and negative rails (or 'busbars') respectively, such that the inductor is connected in series along the positive DC rail. However, other examples are envisaged in which the inductor is connected in series along the negative DC rail. Additionally or alternatively, an inductor may be connected in series along each of the first and second conductors, e.g. there may be an inductor connected along each of the positive and negative rails. Where each of the positive and negative rails or busbars is provided with an inductor, these inductors may be magnetically coupled in some examples, however in other examples the inductors are not magnetically coupled.

In some examples, the controller is arranged to compare the determined capacitance value to a stored capacitance value and determine a difference between said determined and stored capacitance values. In a set of examples, the motor drive comprises a memory, for example a non-volatile memory (NVM), where the stored capacitance values are held. The controller may, in some examples, be arranged to store the determined capacitance value in the memory and/or to retrieve the stored capacitance value from memory.

In some examples, the controller is arranged to compare the determined capacitance value to a plurality of stored capacitance values or a stored capacitance trend. Thus, in such examples, the controller may determine the rate at which the capacitance of the DC link capacitor is changing and determine whether replacement or maintenance is required and, if necessary, raise an alert.

While the input of the notch filter could be directly connected between the inductor and DC link capacitor, in some examples the DC bus portion comprises a voltage sensor arranged to produce a sense signal dependent on a voltage between the inductor and the DC link capacitor. Such a sensor may help to determine when the capacitor has reached full voltage during the power up sequence, and/or it may help to detect overvoltage situations during the operation of the motor in regenerative mode. It will be appreciated that there are various voltage sensors that may be used, however in some examples, the voltage sensor comprises a potential divider connected between the inductor and DC link capacitor, wherein the node is connected between first and second resistors of the potential divider. In some such examples, the potential divider is connected in parallel across the first and second conductors. This potential divider-based voltage sensor may already be a component provided as part of (or alongside) a conventional controller and thus may advantageously not require any further hardware. The voltage sensor may also include an isolation amplifier and/or an ADC.

Those skilled in the art will appreciate that there are a number of tuneable notch filters, known in the art per se, that could be used to implement the motor drive disclosed herein. However, in some examples, the notch filter comprises: a first low pass filter block arranged to remove a DC component of a voltage at the input of the notch filter to produce an AC component; a forward rotation vector block arranged to generate a first vector having a first element set to zero and a second element set to the AC component, and to recalculate said vector in a reference frame rotating at the resonant frequency of the notch filter, thereby generating a second vector; a second low pass filter block arranged to filter a first element and a second element of second vector, thereby generating a third vector; and a backward rotation vector block arranged to recalculate the third vector in a stationary reference frame, thereby generating a fourth vector; wherein a second element of the fourth vector is output as the filtered signal.

This is novel and inventive in its own right and thus, when viewed from a second aspect, the present disclosure provides a notch filter comprising: a first low pass filter block arranged to remove a DC component of a voltage at the input of the notch filter to produce an AC component; a forward rotation vector block arranged to generate a first vector having an first element set to zero and a second element set to the AC component, and to recalculate said vector in a reference frame rotating at a resonant frequency of the notch filter, thereby generating a second vector; a second low pass filter block arranged to filter a first element and a second element of second vector, thereby generating a third vector; and a backward rotation vector block arranged to recalculate the third vector in a stationary reference frame, thereby generating a fourth vector; wherein a second element of the fourth vector is provided at an output of the notch filter.

This second aspect of the present disclosure extends to a method of filtering an input voltage, the method comprising: removing a DC component of the input voltage to produce an AC component; generating a first vector having a first element set to zero and a second element set to the AC component; recalculating said first vector in a reference frame rotating at a resonant frequency of the notch filter, thereby generating a second vector; low-pass filtering a first element and a second element of second vector, thereby generating a third vector; recalculating the third vector in a stationary reference frame, thereby generating a fourth vector; and providing a second element of the fourth vector as an output.

It will be appreciated that the term 'low pass filter' means a filter that substantially removes components having a frequency greater than a corresponding cut-off frequency of the filter, but substantially allows components having a frequency less than the cut-off frequency of the filter.

In some examples, the first, second, third, and fourth vectors are two-dimensional vectors. The first element of each vector may be an x-component and the second element of each vector may be a y-component. However, the terms 'x-component' and 'y-component' are not intended to limit the scope to a particular parameterisation in which the 'upper' element of the first vector is set to zero and the 'lower' element is set to the AC component, as these roles may be readily exchanged without deviating from the scope of the invention by rearranging the rotation vectors applied by the vector blocks.

In some examples the external load comprises a motor. In some such examples, the motor is arranged to drive an actuator, a fan, and/or a pump, e.g. an oil pump for a hydraulic system.

In some examples, the supply current provided by the inverter is generated by a current control loop arrangement, wherein the current control loop arrangement is arranged to receive a modulation signal from the controller. This current control loop arrangement may comprise a 'cascaded control loop'. Such a cascaded control loop may include a plurality of control loops embedded inside each other in accordance with the principles of 'cascade control', known in the art per se. In brief, each loop calculates the set-point for the next loop. By way of non-limiting example only, the outermost loop may comprise a speed control loop which receives a speed reference from an external command and calculates a speed error as a difference between the speed reference and a measured speed. This speed error may drive a proportional-integral (PI) controller that calculates a motor current reference which may then be used as the set point of the inner current control loop. Similarly, a current error may calculated as a difference between the current set point and a measured motor current. This, in turn, may drive a PI controller that generates a motor voltage reference, which may then be PWM modulated and transmitted to the power inverter.

It will be appreciated that the optional features described in respect of examples of any aspect of the present disclosure also apply to all other aspects of the present disclosure as appropriate.

BRIEF DESCRIPTION OF THE DRAWINGS

Certain examples of the present disclosure will now be described with reference to the accompanying drawings, in which.

DETAILED DESCRIPTION

Figure 1:
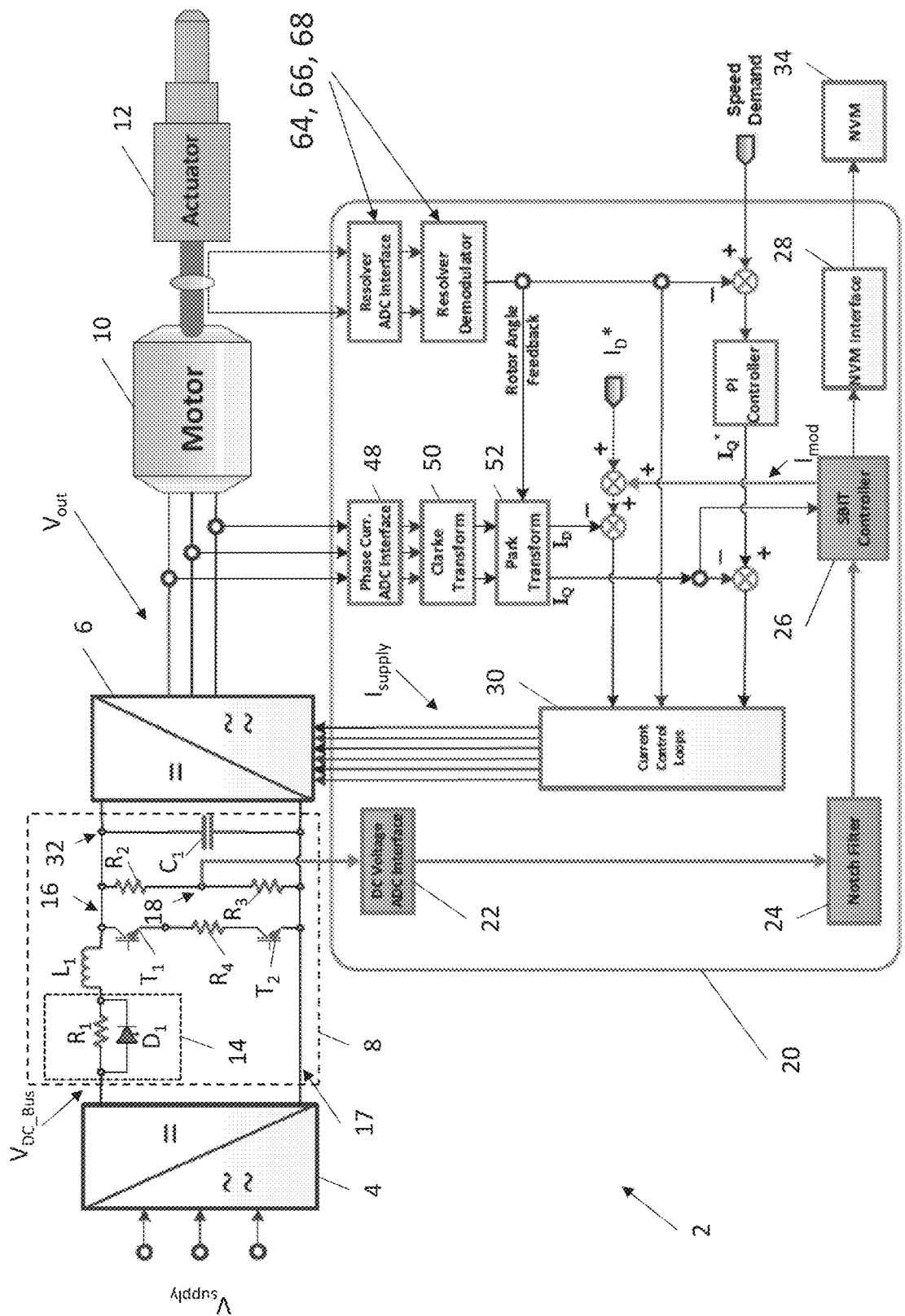
FIG. 1 is a schematic diagram of a motor drive system in accordance with an example of the present disclosure.

FIG. 1 is a schematic diagram of a motor drive system 2 in accordance with an example of the present disclosure. The motor drive system 2 includes a front-end rectifier 4 and a power inverter 6, which are connected by a DC bus 8.

The front-end rectifier 4 is arranged to receive an externally supplied AC voltage Vsupply, which in this example is a three-phase AC input voltage. The rectifier 4 converts this AC voltage Vsupply to a DC bus voltage VDC_Bus which is transferred to the inverter 6 across the DC bus 8, the details of which are discussed in more detail below. It will be appreciated that other arrangements are possible, e.g. in which the rectifier 4 receives a single-phase input. Thus the rectifier 4 is an AC-to-DC converter (ADC).

The inverter 6 takes the DC bus voltage VDC_Bus and converts it back to an AC output voltage Vout suitable for supply to the connected load. In this example, the inverter 6 supplies the output voltage Vout to a motor 10, which in turn is arranged to drive an actuator 12. In this example, the output voltage Vout provided to the motor 10 is a three-phase voltage suitable to drive the three-phase motor 10. It will be appreciated that other arrangements are possible, e.g. in which the inverter 6 produces a single-phase output. Thus the inverter 6 is a DC-to-AC converter (DAC).

The DC bus 8 includes a protective arrangement 14 constructed from a resistor R1 connected in parallel with a thyristor D1. This resistor R1 serves to limit the inrush current during DC link pre-charge immediately after the input power supply is switched on. The thyristor D1 provides a bypass around the resistor R1 after the end of the pre-charge in order to limit power losses of the motor drive system 2.

The output of the protective arrangement 14 is connected to a terminal of an inductor L1 which is arranged in series along the positive conductor 16 of the DC bus 8. The other terminal of the inductor L1 is connected to the input of the inverter 6.

A DC link capacitor C1 is connected in parallel between the positive conductor 16 and the negative conductor 17 of the DC bus 8. This DC link capacitor C1 serves to smooth the DC bus voltage VDC_Bus output of the front-end rectifier 4. The DC link capacitor also protects upstream circuits from the transient response of downstream circuits.

A potential divider is connected in parallel to the DC link capacitor C1 between the positive conductor 16 and the negative conductor 17 of the DC bus 8. The potential divider is constructed from a pair of resistors R2, R3, having a node 18 connected between them. This node 18 is connected to a capacitance monitor portion 20, as explained in further detail below.

A pair of transistors T1, T2 and a resistor R4 are provided for operation of the motor in its 'regenerative mode' which may, for example, be used when the motor is working to slow down the mechanical actuator. In this case, kinetic energy is converted to electrical energy which is transferred to the capacitor as electrical charge. In other words, the motor operates as a generator in such situations. In order to protect the system from the capacitor voltage increasing to potentially dangerously high levels, the two additional transistors T1, T2 are switched on to allow the excess capacitor charge to discharge across the so-called 'brake resistor' R4.

The capacitance monitor portion 20 includes a DC Voltage ADC interface 22, a tuneable notch filter 24, an PBIT controller 26, an NVM interface 28, and a current control loop 30. It will be appreciated that the 'capacitance monitor portion' 20 is a collective term for the components used to detect degradation of the DC link capacitor C1 and is used for the purposes of explanation only. Some or all of the components in this portion 20 may be wholly separate components (i.e. physically distinct), or may be integrated within the same component, e.g. implemented as functions of a microprocessor, application specific integrated circuit (ASIC), field-programmable gate array (FPGA), etc., as appropriate. In preferred examples, the use of discrete physical components is minimised and ideally avoided in order to reduce the cost and complexity of the system.

The DC Voltage ADC interface 22 is connected to the node 18 between the potential divider resistors R2, R3, and thus receives a voltage that is proportional to the voltage at the node 32 between the inductor L1 and the DC link capacitor C1, in accordance with the ratio between the resistances of the potential divider resistors R2, R3. This DC Voltage ADC interface 22 converts the analogue voltage at the node 18 to a digital value supplied to the notch filter 24. In practice, this DC Voltage ADC interface 22 may form part of the notch filter 24 or may be an existing logic block within the motor drive, however it is shown as a discrete block in FIG. 1 for ease of reference. This ADC interface 22 may, in general, be an existing ADC interface already present within an otherwise-conventional motor drive that can be repurposed for the purposes of the present disclosure.

The notch filter 24 is tuneable across an operating range of frequencies around the nominal resonant frequency of the LC circuit comprising the inductor L1 and the DC link capacitor C1, assuming no degradation of the DC link capacitor C1. The resonant frequency of the notch filter 24 is controlled in steps by the PBIT controller 26 as explained in further detail below. Essentially, the notch filter 24 is a highly selective filter (i.e. it has a relatively narrow pass band, potentially of only several Hertz) that outputs a signal having a magnitude dependent on the magnitude of frequency components of the signal at its input that fall within the notch filter's pass band.

The PBIT controller 26 receives the output of the notch filter 24 and controls the frequency sweep-based test of the motor drive 2. The controller 26 provides a modulating, sinusoidal AC current to the current control loop 30, which uses this signal to determine a voltage demand which is subsequently PWM modulated and provided to the inverter 6. The current control loop 30 modulates a steady state current ID that, in this example, is the steady state D-axis current ID* supplied to the motor 10.

The provision of PWM switching patterns provided to the inverter 6 gives rise to an alternating voltage across the motor and a corresponding alternating current the DC link capacitor C1, i.e. it indirectly supplies an AC input to the LC resonator within the DC bus 8. As a result, the magnitude of the voltage at the node 18 will vary in response to this indirectly injected AC input to the LC resonator. The magnitude of the voltage at the node 18 will depend on the capacitance of the DC link capacitor C1, which will in turn affect the cut-off frequency of the LC resonator.

The PBIT controller 26 steps through a number of different resonant frequency values, wherein for each step, the frequency of the modulating current Imod applied to the current control loop 30 and the tuned frequency of the notch filter 24 are updated to the same value.

The magnitude of the output of the notch filter 24 is observed by the PBIT controller 26 for each frequency step and may be stored in a NVM 34 via the NVM interface 28. While sweeping through the frequencies, the PBIT controller 26 determines which of the frequency settings gives rise to the greatest magnitude at the output of the notch filter 24, thereby determining the approximate resonant frequency of the LC resonator within the DC bus 8.

Once the approximate resonant frequency of the LC resonator within the DC bus 8 is determined, the PBIT controller 26 may then determine the capacitance of the DC link capacitor C1 using the relationship described previously with reference to Equation 2. Depending on the determined capacitance value, the PBIT controller 26 may raise an alert (e.g. if the capacitance value has deviated from its intended value by more than a threshold amount) indicating that replacement or repair of the DC link capacitor C1 (or if necessary part or all of the motor drive 2) is required.

The PBIT controller 26 may also compared the determined capacitance value to one or more previously determined capacitance values stored in the NVM 34 to determine a rate of change of the capacitance and to determine approximately when replacement or repair may be necessary, even if it is not currently required.

Figure 2:
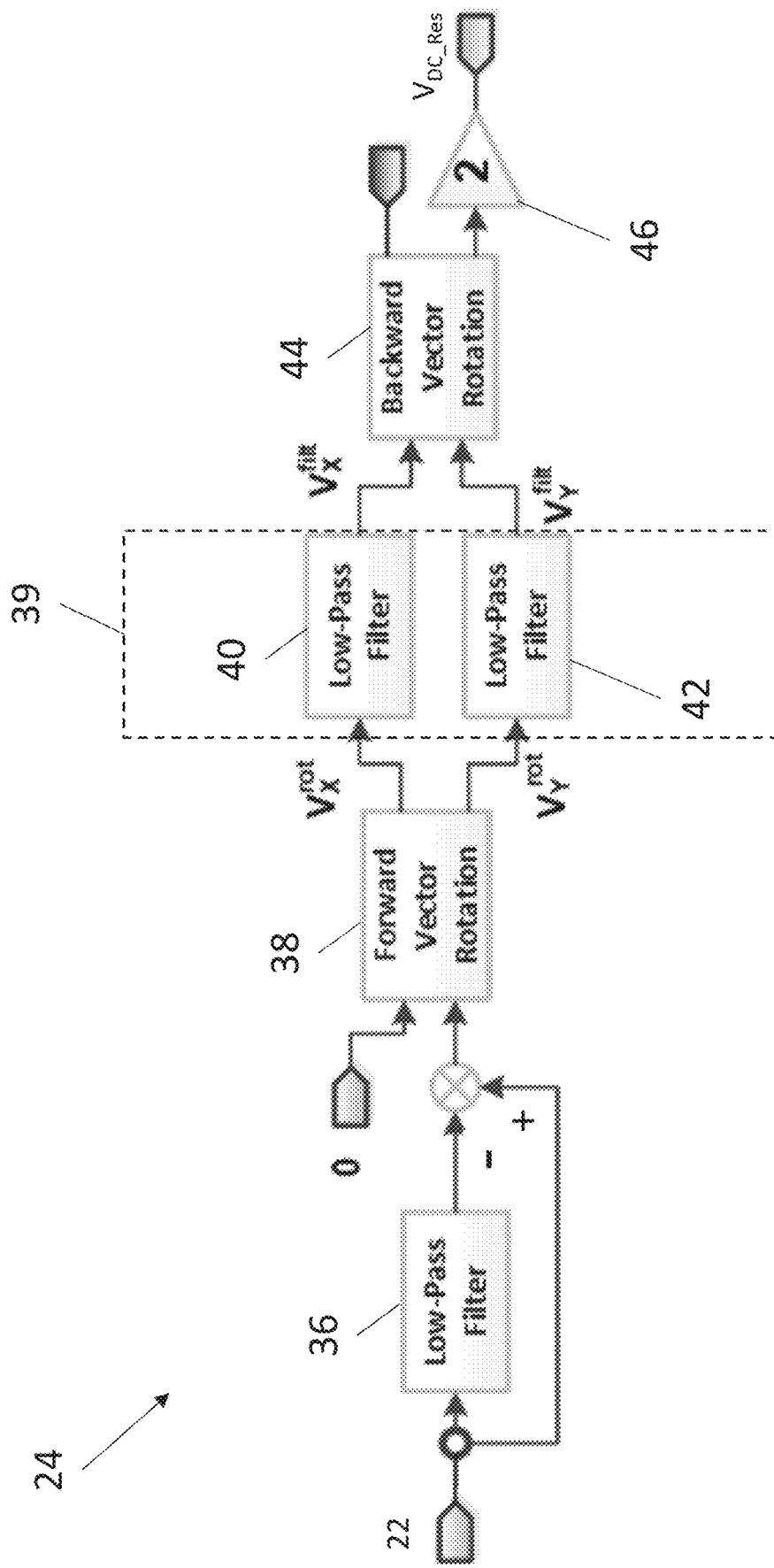
FIG. 2 is a block diagram of a notch filter for use in the motor drive system of FIG. 1.

The construction of a suitable notch filter 24 can be seen in FIG. 2, and the operation of this filter 24 may be understood with reference to FIGS. 3 to 7.

The notch filter 24 comprises a first low pass filter block 36 that is arranged to receive the voltage from the node 18 between the resistors R2, R3 of the potential divider via the DC Voltage ADC interface 22. This low pass filter block 36 produces an 'average' Vdc of the voltage presented at its input (i.e. the DC component of the voltage from the node 18), which is then subtracted from the voltage from the node 18, i.e. the voltage Vcap across DC link capacitor C1, thereby leaving only the AC component of the voltage from the node 18.

A forward rotation vector block 38 is arranged to generate a first vector $$\begin{pmatrix} 0 \\ V_{cap} - V_{dc} \end{pmatrix}$$

having an x-coordinate set to zero and a y-coordinate set to the AC component resulting from the subtraction of the average Vdc from the voltage Vcap across DC link capacitor C1.

This forward rotation vector block 38 then recalculates this vector in a reference frame rotating at the resonant frequency of the notch filter, thereby generating a second vector, in accordance with Equation 3:

$$\begin{pmatrix} V_x^{rot} \\ V_y^{rot} \end{pmatrix} = \begin{pmatrix} \cos \omega t & \sin \omega t \\ -\sin \omega t & \cos \omega t \end{pmatrix} \begin{pmatrix} 0 \\ V_{cap} - V_{dc} \end{pmatrix} \quad \text{Equation 3}$$

Rotation performed by the forward rotation vector block 38

Figure 3:
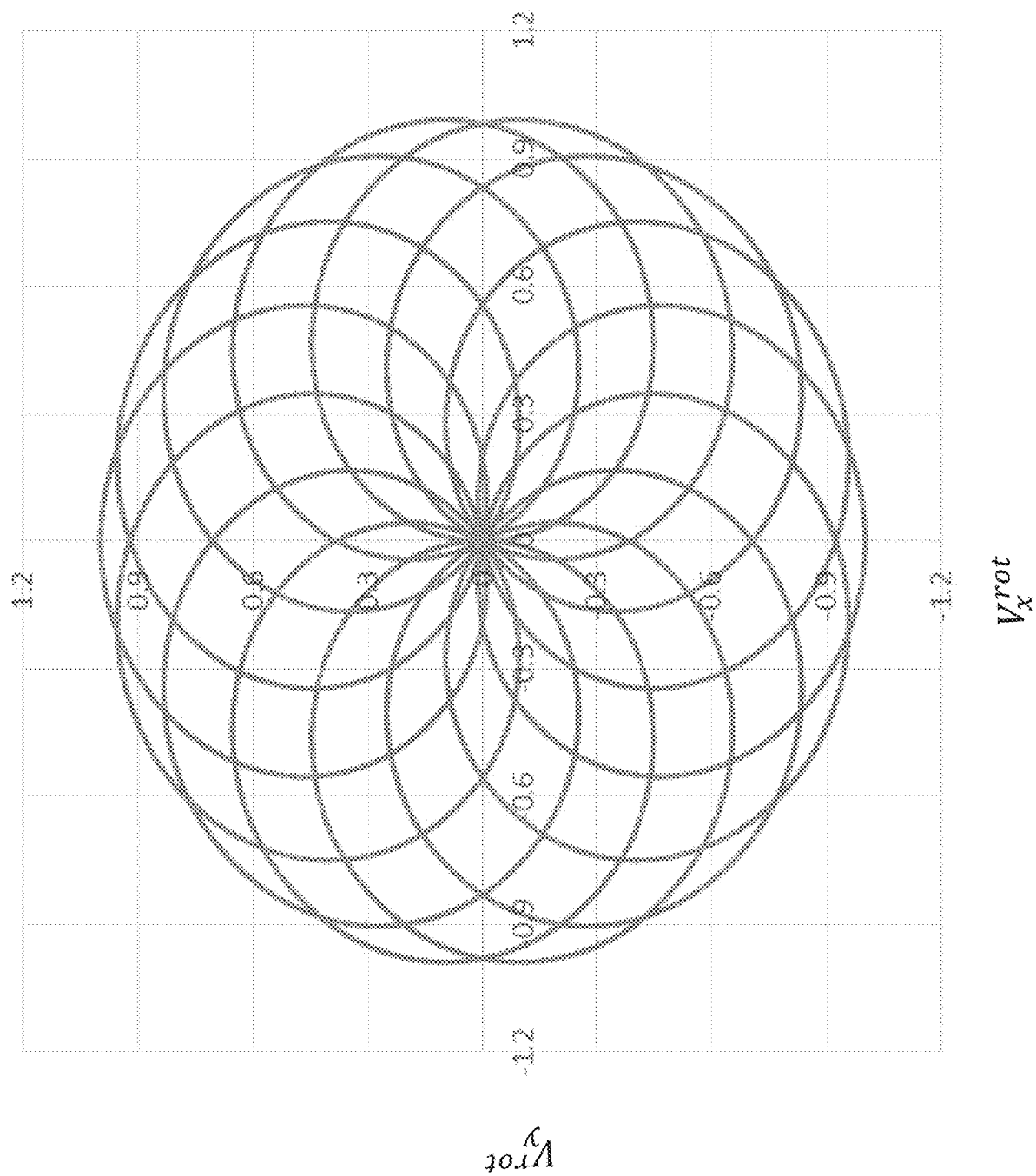
FIG. 3 is a graph of a DC voltage vector in the rotating reference frame.

The trajectory of this vector $$\begin{pmatrix} V_x^{rot} \\ V_y^{rot} \end{pmatrix}$$

can be seen in FIG. 3, which is a graph of the voltage vector in the rotating reference frame. The 'flower-like' pattern that can be seen is a result of the rotating frame of reference. It will be appreciated that the angular frequency ω referred to with reference to FIGS. 3 to 7 is the angular frequency corresponding to the current resonant frequency value f as set by the PBIT controller 26, and may be calculated as ω=2πf.

A second low pass filter block 39—which in this implementation is constructed from two separate low pass filters 40, 42 but could comprise a single filter block in other examples—is arranged to filter the x- and y-components of the second vector, i.e. the output of the forward rotation vector block 38, thereby generating a third vector $$\begin{pmatrix} V_x^{filt} \\ V_y^{filt} \end{pmatrix}.$$

Figure 4:
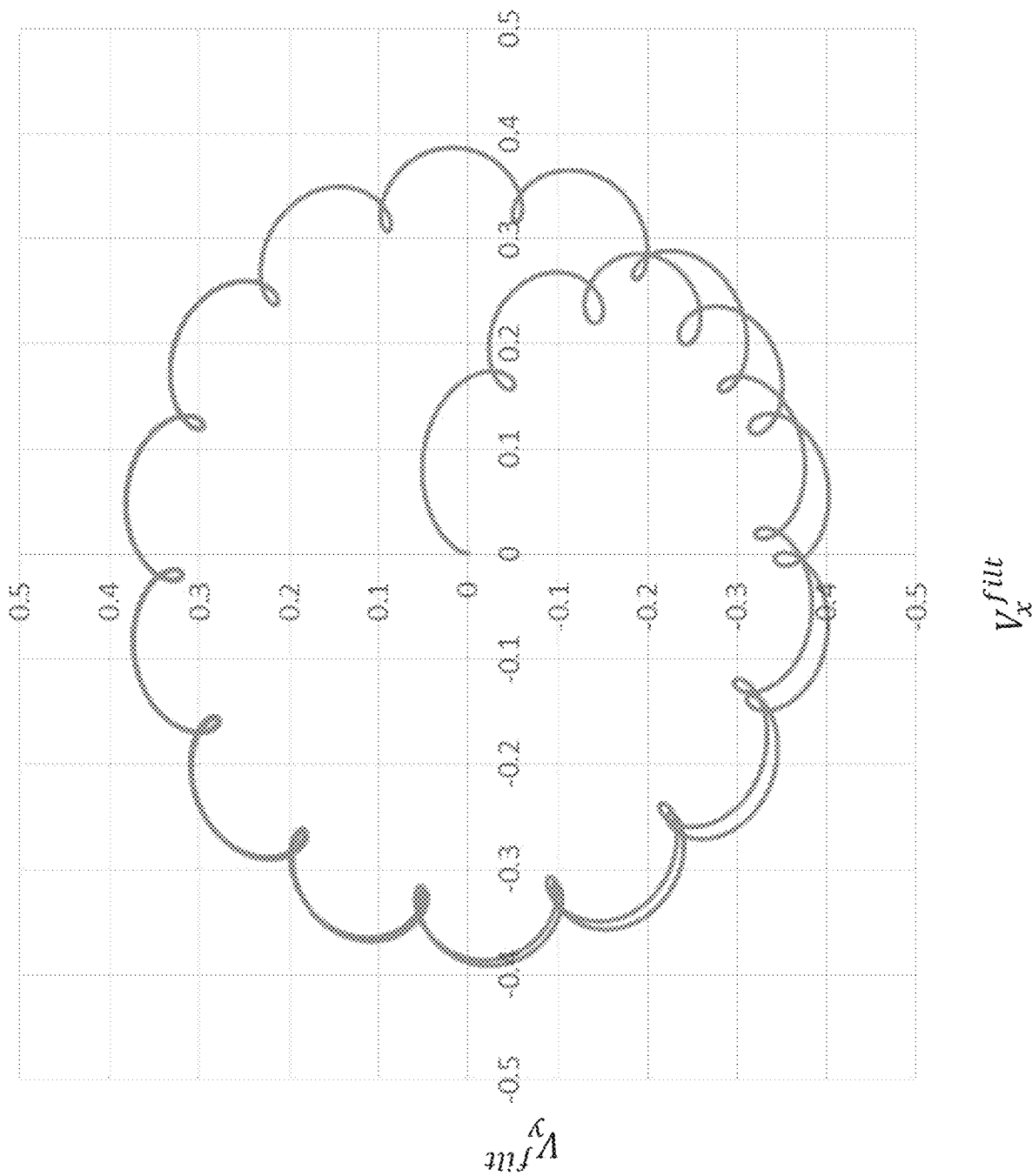
FIG. 4 is a graph of a filtered trajectory of the vector of FIG. 3.

The trajectory of this third filtered vector can be seen in FIG. 4. It should be noted that the filters 40, 42 attenuate the magnitude of the vector by half, however this is compensated for later as outlined below.

A backward rotation vector block 44 is arranged to recalculate the third vector in the stationary reference frame, thereby generating a fourth vector, in accordance with Equation 4:

$$\begin{pmatrix} V_x^{stat} \\ V_y^{stat} \end{pmatrix} = \begin{pmatrix} \cos\omega t & -\sin\omega t \\ \sin\omega t & \cos\omega t \end{pmatrix} \begin{pmatrix} V_x^{filt} \\ V_y^{filt} \end{pmatrix} \quad \text{Equation 4}$$

Rotation performed by the backward rotation vector block 44

Figure 5:
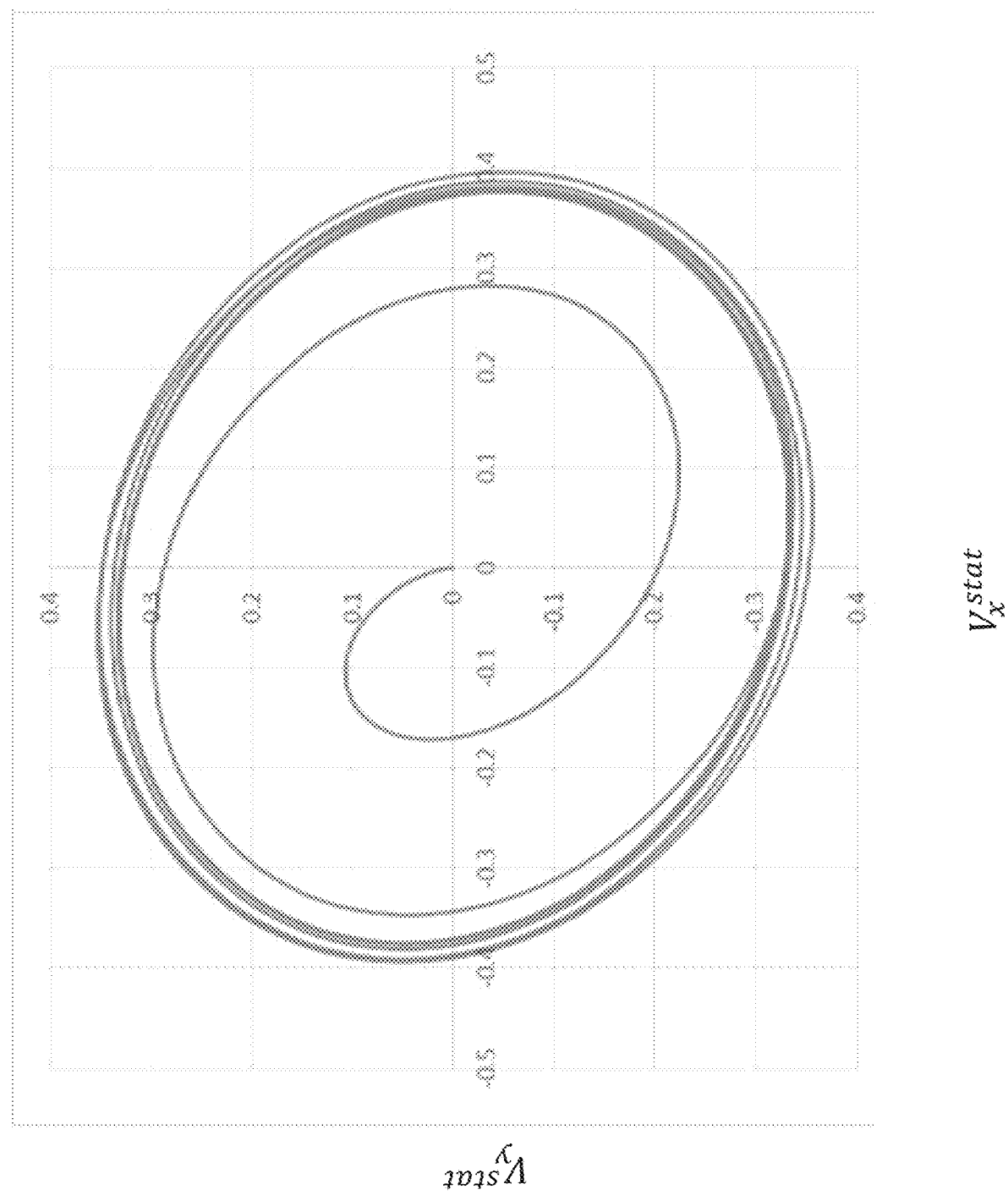
FIG. 5 is a graph of the filtered trajectory of FIG. 4 translated back to a stationary reference frame.

The trajectory of this vector $$\begin{pmatrix} V_x^{stat} \\ V_y^{stat} \end{pmatrix}$$

can be seen in FIG. 5, which is a graph of the voltage vector in the station reference frame. The 'flower-like' pattern that can be seen is a result of the rotating frame of reference.

The y-component $V_y^{stat}$ of the fourth vector is output as the filtered signal, i.e. the resonant voltage amplitude for the current frequency as set by the PBIT controller 26 is extracted from $V_y^{stat}$. Finally an amplifier 46 multiplies the magnitude of the $V_y^{stat}$ by two (i.e. it doubles the magnitude) in order to compensate for the attenuation referred to above.

Figure 6:
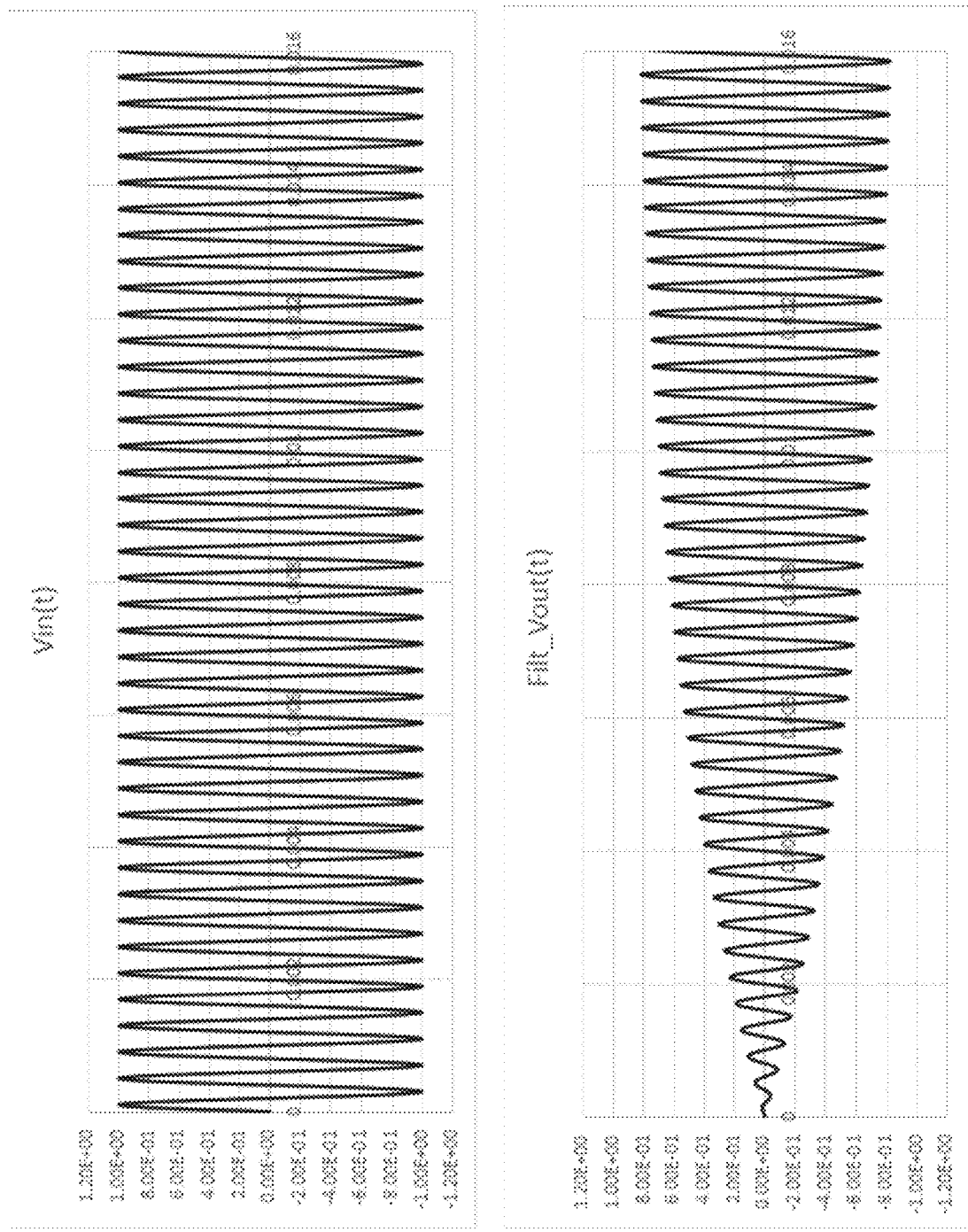
FIG. 6 is a graph of the transient filter response.
Figure 7:
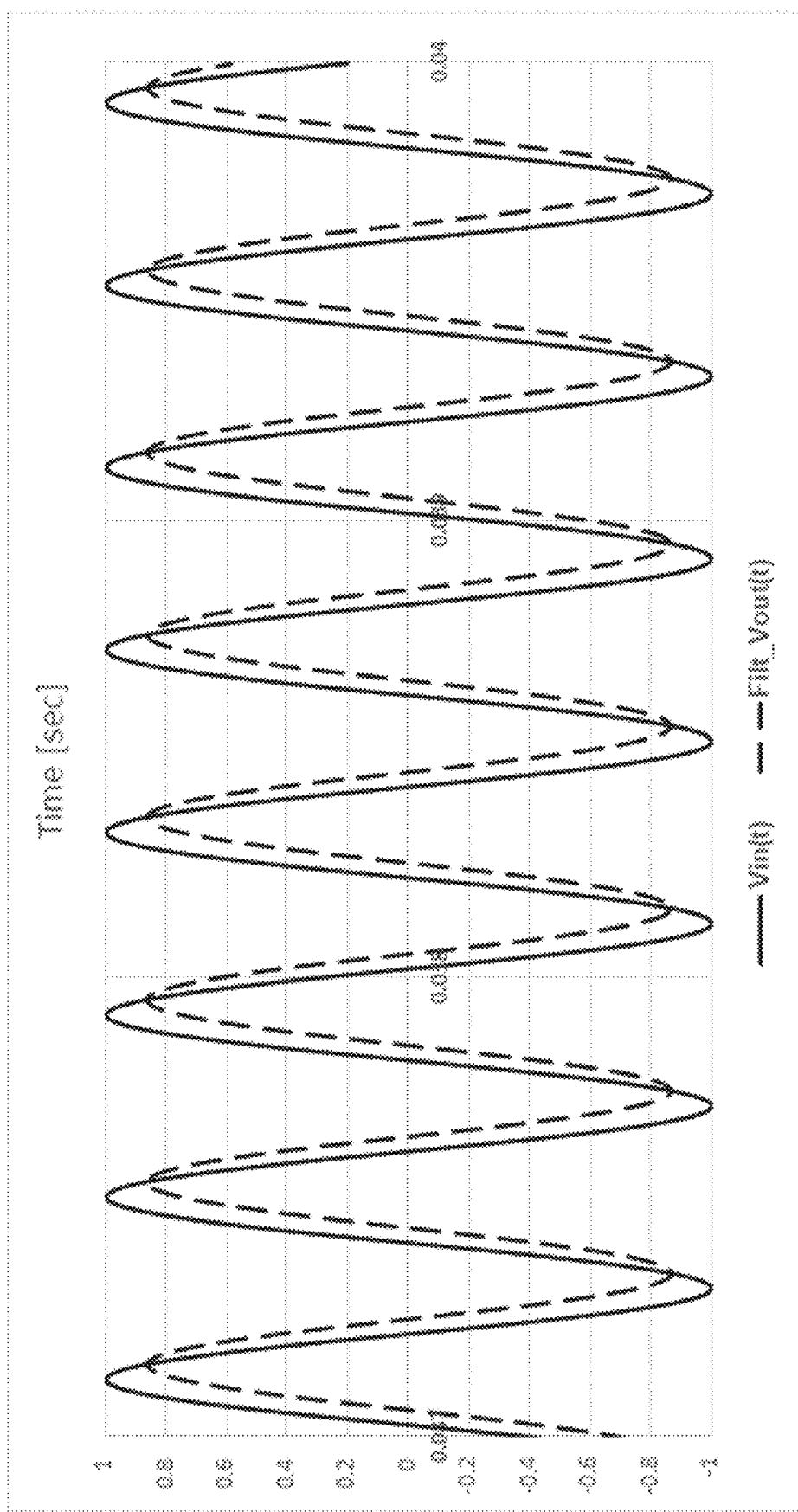
FIG. 7 is a graph of the steady-state filter response.

The length of the transient response increases with decreasing filter bandwidth. The transient response can be adjusted by selecting the order of the low-pass filters 40, 42. Where first order low pass filters are used, these may provide transient responses in the order of tens of milliseconds for a bandwidth of 20 Hz as illustrated by FIG. 6. The steady-state filter response can be seen in FIG. 7.

A shorter transient time can be achieved with second order low-pass filters, where mathematical complexity is traded off for a faster response time.

Figure 8:
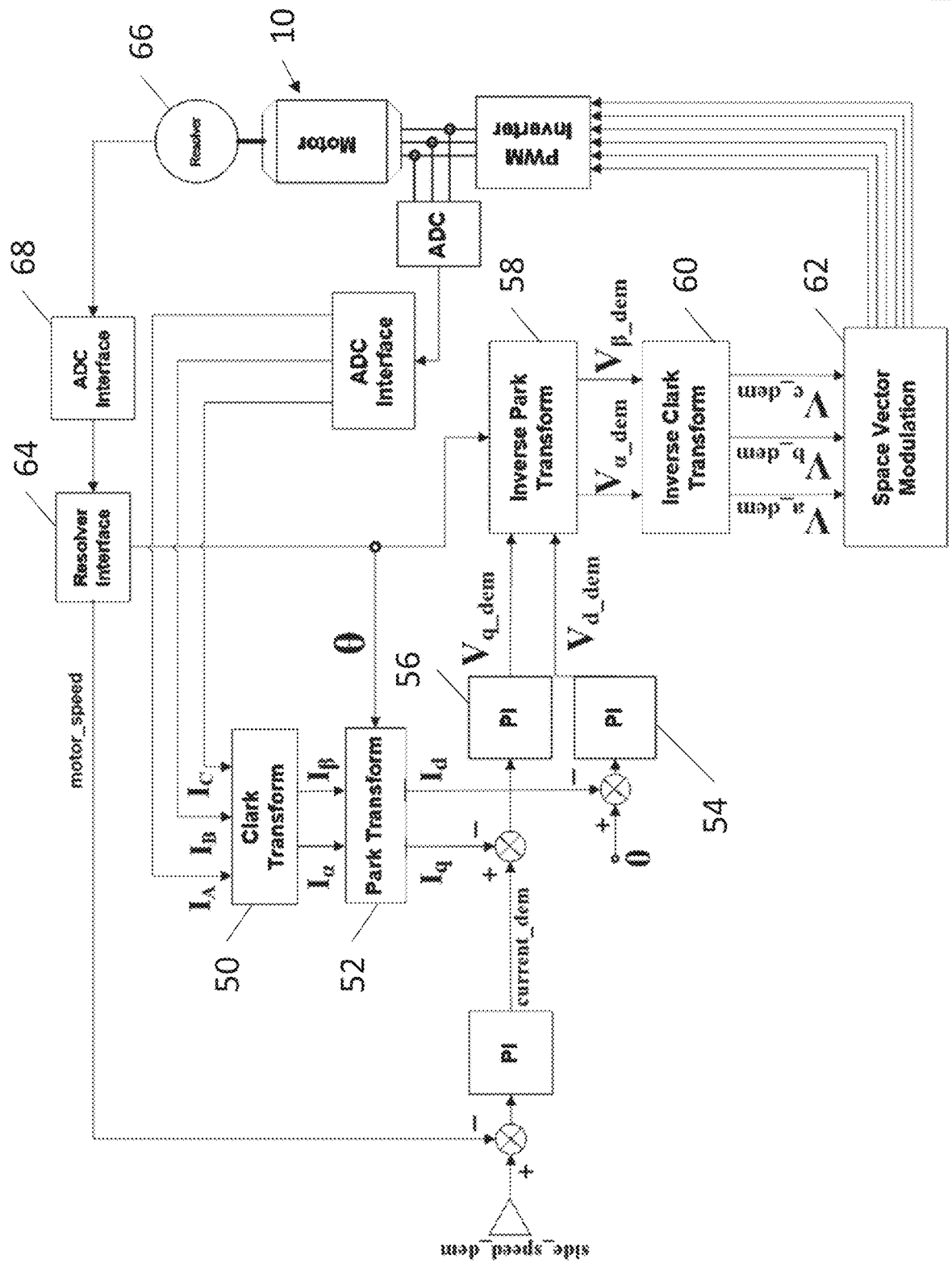
FIG. 8 is a block diagram of the capacitance monitor portion used in the motor drive system of FIG. 1.

Those skilled in the art will readily appreciate the respective functions of the other components of the capacitance monitor portion 20. However, for reference, the capacitance monitor portion 20 also includes a phase current ADC interface 48; a Clarke transform block 50; a Park transform block 52. The structure of these elements may be understood with reference to FIG. 8, in which some of the functional blocks are broken down into simpler functional blocks for ease of reference.

The phase current ADC interface 48 is a functional block which reads the values of the three motor phase currents from A/D Converters connected to analogue current sensors.

Figure 9A:
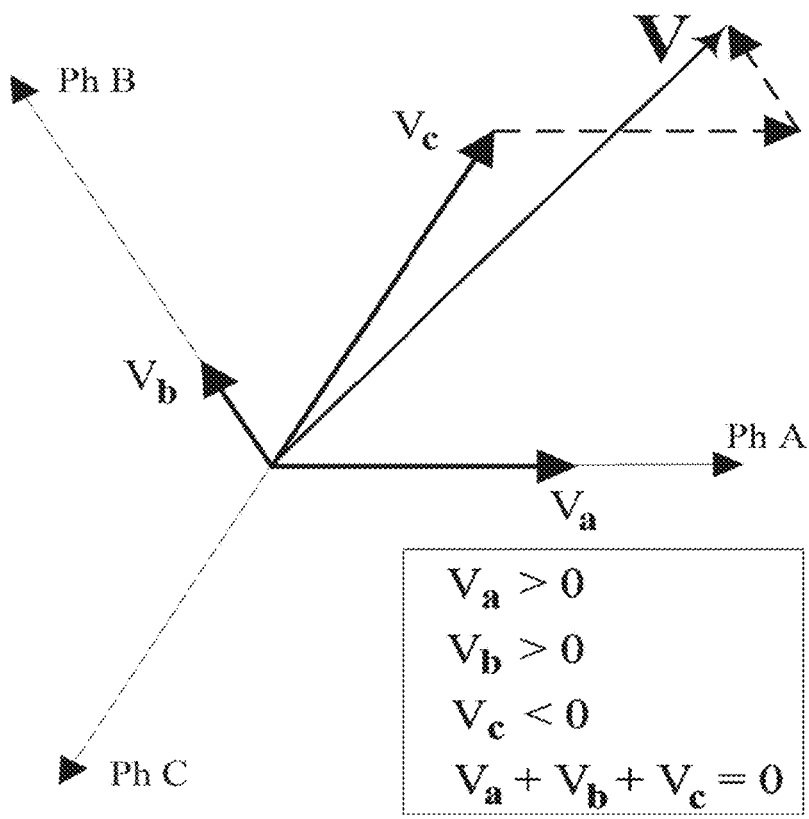
FIGS. 9A and 9B are vector plots illustrating a Clarke transform.

The Clarke transform block 50 is a functional block which calculates a so-called 'stator current space vector'. Those skilled in the art will appreciate that this 'space vector' is a generally understood term in the field of motor control theory which applies to any set of three quantities such as three phase currents, three phase voltages, three magnetic fluxes, etc. The original quantities (currents, voltages, or magnetic fluxes as appropriate) are scalar but they are associated with three basis vectors arranged 120° apart around the origin of a two-dimensional space. Positive scalars are transformed into vectors in the direction of the associated basis vector, whereas negative scalars produce opposite vectors. The final 'space vector' is the sum of these three scalars-converted-to-vectors, as can be seen in FIG. 9A.

Figure 9B:
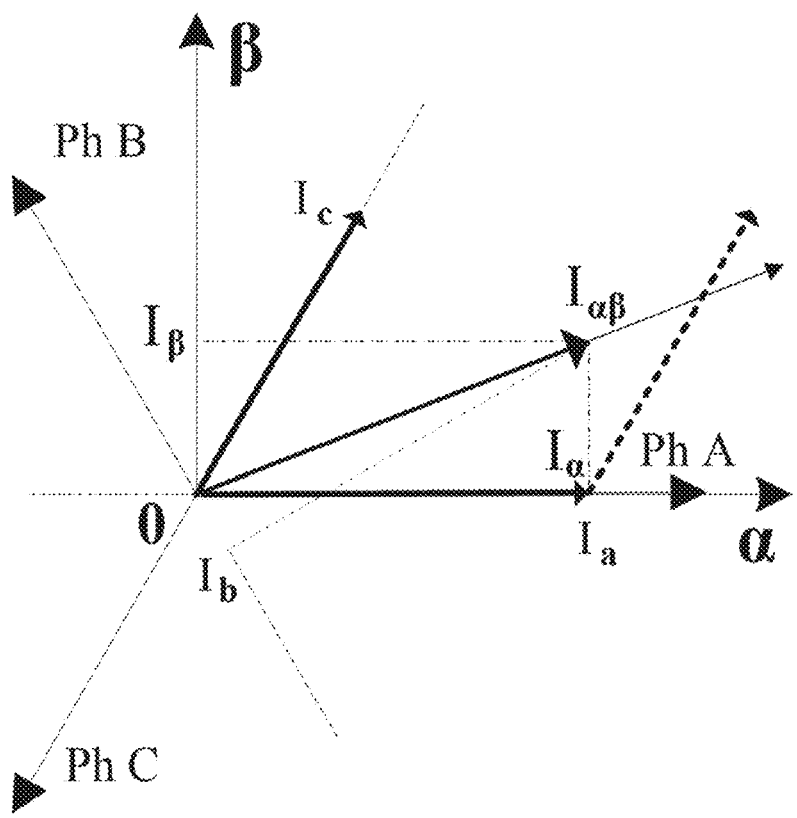

The space vector is algebraically represented in a coordinate system $(\alpha, \beta)$, as can be seen in FIG. 9B. The vector is also rescaled such that the length of the space vector is equal to the amplitude of the motor phase currents or voltages or fluxes. The resulting equations for the Clarke transform are given as per Equation 5 below:

$$\begin{cases} I_\alpha = I_a \\ I_\beta = \dfrac{I_b - I_c}{\sqrt{3}} \end{cases} \quad \text{Equation 5}$$

Clarke Transform

Figure 10A:
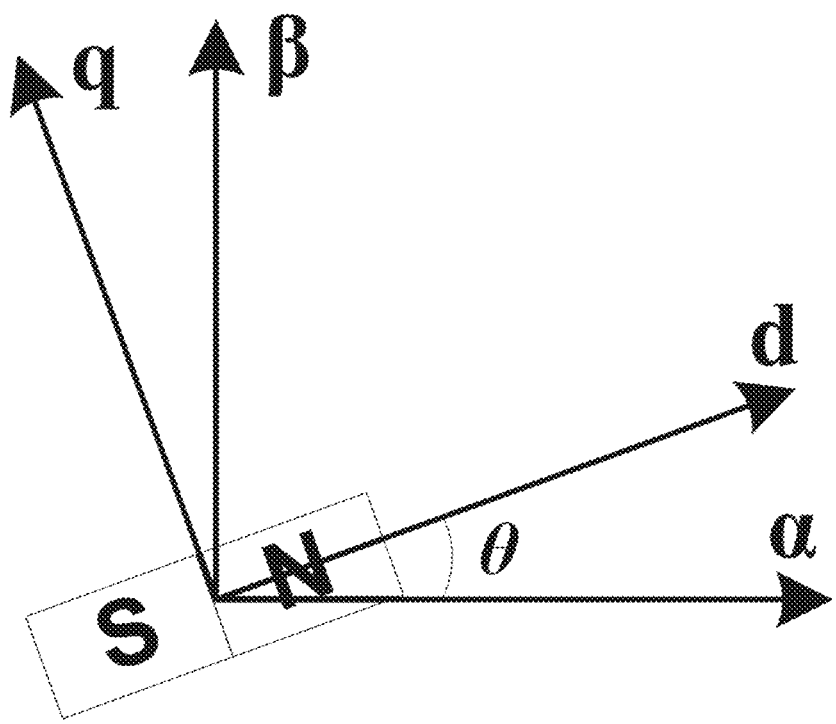
FIGS. 10A and 10B are vector plots illustrating a Park transform.
Figure 10B:
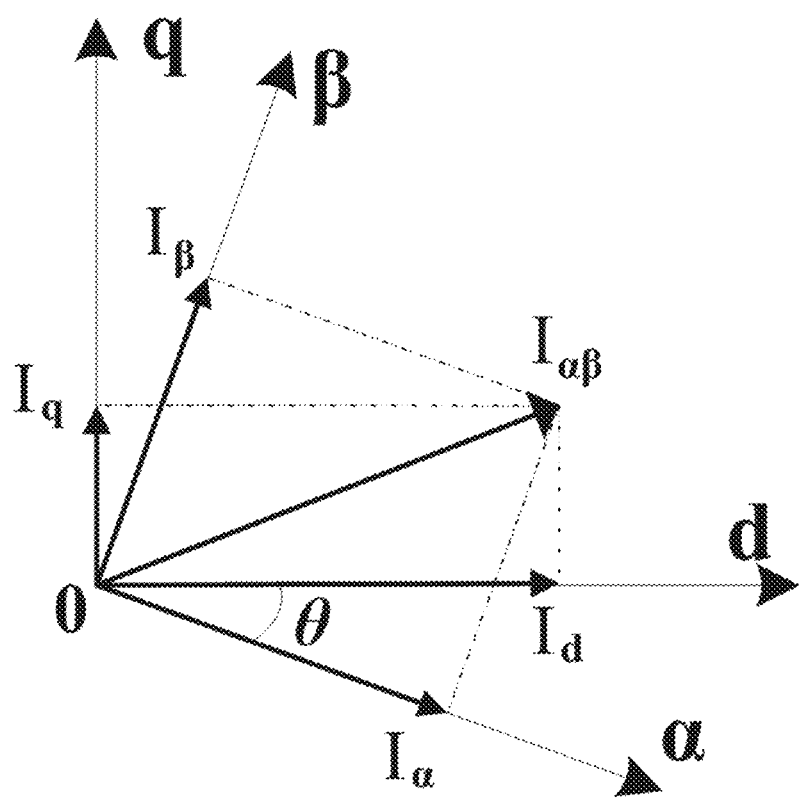

The Park transform block 52 is a functional block which recalculates the current space vector from the $(\alpha, \beta)$ coordinates into $(d, q)$ coordinate system which is aligned to the magnetic field of the rotor and it rotates synchronously with the rotor, as can be seen in FIGS. 10A and 10B, where the equations for the Park transform are given as per Equation 6 below:

$$\begin{pmatrix} I_d \\ I_q \end{pmatrix} = \begin{pmatrix} \cos\theta & \sin\theta \\ -\sin\theta & \cos\theta \end{pmatrix} \begin{pmatrix} I_\alpha \\ I_\beta \end{pmatrix} \quad \text{Equation 6}$$

Park Transform

The current control loops 30 include two PI controllers 54, 56. The first PI controller 54 is arranged to control the d-axis current component $I_d$ and the other PI controller 56 is arranged to control the q-axis current component $I_q$. These PI controllers 54, 56 determine the appropriate current error (i.e. the difference between set point and measured current) and produce corresponding voltage demands $V_{d\_dem}$ and $V_{q\_dem}$ respectively.

An Inverse Park transform block 58 changes the coordinates of voltage space vector $(V_{d\_dem}, V_{q\_dem})$ to $(V_{\alpha\_dem}, V_{\beta\_dem})$ as per Equation 7 below:

$$\begin{pmatrix} I_\alpha^{dem} \\ I_\beta^{dem} \end{pmatrix} = \begin{pmatrix} \cos\theta & -\sin\theta \\ \sin\theta & \cos\theta \end{pmatrix} \begin{pmatrix} I_d^{dem} \\ I_q^{dem} \end{pmatrix} \quad \text{Equation 7}$$

Inverse Park Transform

An Inverse Clarke transform block 60 converts the space vector $(V_{\alpha\_dem}, V_{\beta\_dem})$ to individual phase voltage demands $V_{a\_dem}, V_{b\_dem}, V_{c\_dem}$ as per Equation 8 below:

$$\begin{cases} V_a^{dem} = V_\alpha^{dem} \\ V_b^{dem} = -\dfrac{V_\alpha^{dem}}{2} + \dfrac{\sqrt{3}}{2} V_\beta^{dem} \\ V_c^{dem} = -\dfrac{V_\alpha^{dem}}{2} - \dfrac{\sqrt{3}}{2} V_\beta^{dem} \end{cases} \quad \text{Equation 8}$$

Inverse Clarke Transform

Figure 11:
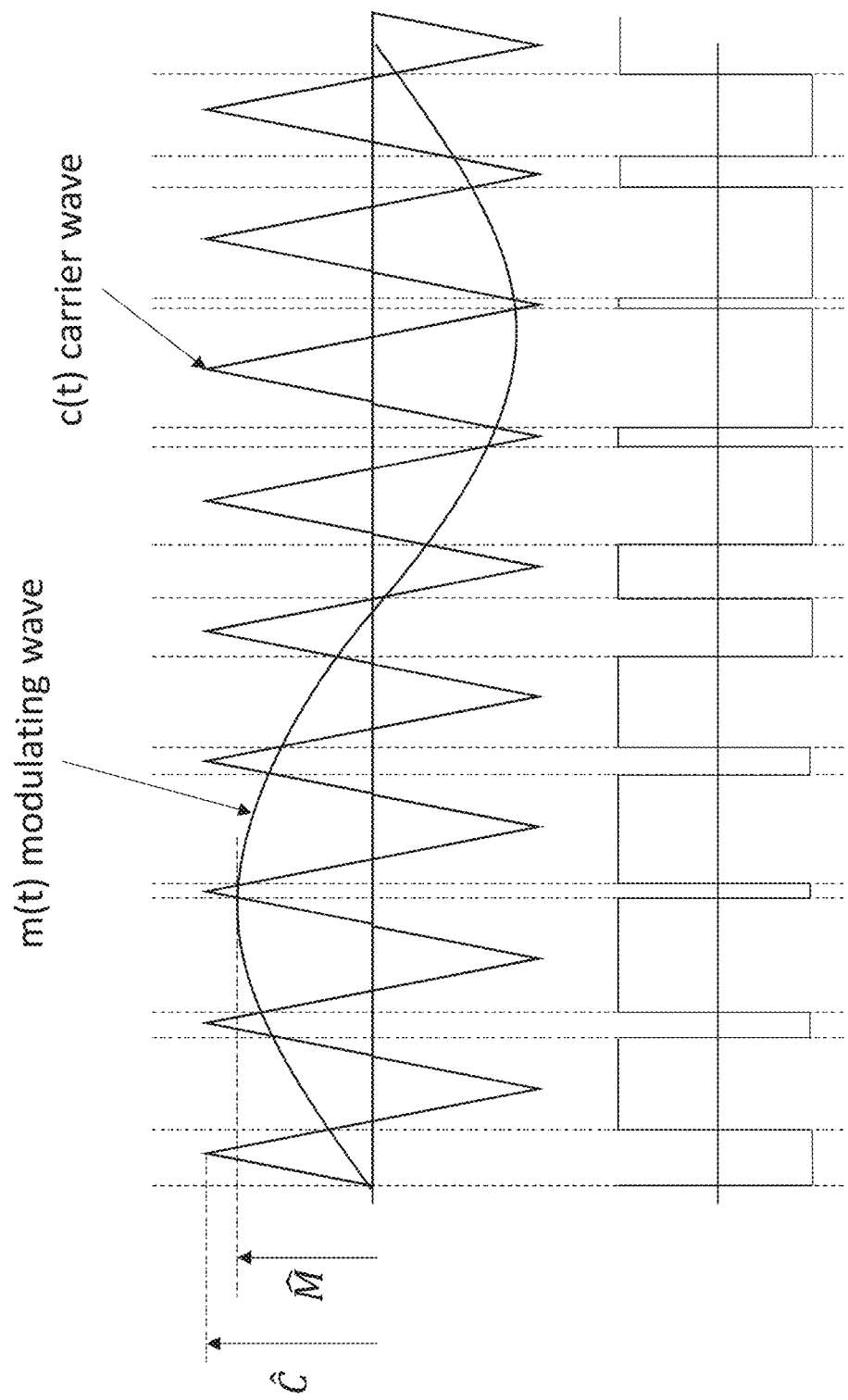
FIG. 11 is a graph illustrating a PWM modulation scheme.

A PWM modulator 62 transforms the individual phase voltage demands into pulse-width modulation patterns, where an illustrative example of a basic PWM modulation scheme can be seen in FIG. 11.

Also provided is a resolver interface 64 which is a functional block that calculates motor speed and rotor angular position based on the feedback signals provided by a position sensor, in this case a resolver 66 (which is connected to the interface 64 via an ADC interface 68). The two feedback signals are typically named 'Sin' and 'Cos' because the corresponding signals are amplitude-modulated signals with amplitudes proportional to the sine and the cosine of the rotor angle. The resolver interface 64 performs the demodulation of the resolver feedback signals to extract speed and position information. The resolver interface 64 is connected to the ADC 68 which receive the analogue Sin and Cos signals from the resolver 66.

Thus it will be appreciated that examples of the present disclosure provide an improved motor drive system and method of operating the same in which the capacitance of the DC link capacitor is determined by performing a frequency sweep to probe the resonant frequency of the effective resonant circuit and thereby determine the current level of degradation of the DC link capacitor. In some examples, dangerous capacitance drops due to dielectric breakdown may be detected very early, and potentially immediately. Also provided herein is a novel notch filter and associated method.

The logical functions used by the components (e.g. the filtering and rotation functions used by the notch filter) may, in some examples, already be otherwise present in a conventional motor drive and thus may advantageously require no additional hardware to implement. The present disclosure may therefore provide yet further volume and weight savings which is advantageous for e.g. aerospace applications.

Extraction of general capacitor degradation trends across all units of a whole aircraft fleet may be achieved, which may be useful for analysing reliability and in-service problems. Furthermore, early detection of capacitor degradation may help to schedule maintenance operations for particular units.

While specific examples of the disclosure have been described in detail, it will be appreciated by those skilled in the art that the examples described in detail are not limiting on the scope of the disclosure.

The invention claimed is:

1. A motor drive comprising:
   a rectifier circuit portion arranged to receive an externally supplied AC voltage and to generate a DC bus voltage therefrom;
   an inverter circuit portion arranged to receive the DC bus voltage and to generate an AC output voltage therefrom for supply to an external load;
   a DC bus portion connected between said rectifier and inverter circuit portions, said DC bus portion comprising first and second conductors, wherein an inductor is connected in series along the first conductor between said rectifier and inverter circuit portions, and wherein a DC link capacitor is connected in parallel between the first and second conductors;
   a notch filter having a tuneable resonant frequency, wherein a voltage across the DC link capacitor is input to the notch filter, the notch filter being arranged to supply a filtered signal; and
   a controller arranged to vary the resonant frequency of the notch filter and to modulate a supply current provided by the inverter circuit portion with a probe current signal at the resonant frequency;
   wherein the controller is arranged to vary the resonant frequency to a plurality of values across an operational range, to measure an amplitude of the filtered signal, to determine which of the plurality of values of the resonant frequency has a maximal amplitude of the filtered signal associated therewith, and to determine a capacitance value of the DC link capacitor from said value of the resonant frequency associated with the maximal amplitude.

2. The motor drive as claimed in claim 1, wherein the controller determines the capacitance value during a power-up procedure of the motor drive.

3. The motor drive as claimed in claim 1, wherein the controller generates an alert when the determined capacitance of the DC link capacitor differs from a target value by more than a threshold amount.

4. The motor drive as claimed in claim 1, wherein the controller is arranged to compare the determined capacitance value to a stored capacitance value and determine a difference between said determined and stored capacitance values.

5. The motor drive as claimed in claim 4, wherein the controller is arranged to compare the determined capacitance value to a plurality of stored capacitance values or a stored capacitance trend.

6. The motor drive as claimed in claim 1, wherein the DC bus portion comprises a voltage sensor arranged to produce a sense signal dependent on a voltage between the inductor and the DC link capacitor.

7. The motor drive as claimed in claim 6, wherein the voltage sensor comprises a potential divider connected between the inductor and DC link capacitor, and wherein the node is connected between first and second resistors of the potential divider.

8. The motor drive as claimed in claim 7, wherein the potential divider is connected in parallel across the first and second conductors.

9. The motor drive as claimed in claim 1, wherein the notch filter comprises:
   a first low pass filter block arranged to remove a DC component of a voltage at the input of the notch filter to produce an AC component;
   a forward rotation vector block arranged to generate a first vector having a first element set to zero and a second element set to the AC component, and to recalculate said vector in a reference frame rotating at the resonant frequency of the notch filter, thereby generating a second vector;
   a second low pass filter block arranged to filter a first element and a second element of second vector, thereby generating a third vector; and
   a backward rotation vector block arranged to recalculate the third vector in a stationary reference frame, thereby generating a fourth vector;
   wherein a second element of the fourth vector is output as the filtered signal.

10. The motor drive as claimed in claim 9, wherein the first, second, third, and fourth vectors are two-dimensional vectors.

11. The motor drive as claimed in claim 9, wherein the first element of each vector is an x-component and the second element of each vector is a y-component.

12. The motor drive as claimed in claim 1, wherein the external load comprises a motor, optionally wherein the motor is arranged to drive an actuator.

13. The motor drive as claimed in claim 1, wherein the supply current provided by the inverter is generated by a cascaded current control loop arrangement.

14. A method of operating a motor drive comprising:
   a rectifier circuit portion and an inverter circuit portion having a DC bus portion connected therebetween, said DC bus portion comprising first and second conductors, wherein an inductor is connected in series along the first conductor between said rectifier and inverter circuit portions, and wherein a DC link capacitor is connected in parallel between the first and second conductors; and a notch filter having a tuneable resonant frequency, wherein a voltage across the DC link capacitor is input to the notch filter, the notch filter being arranged to supply a filtered signal;

wherein the method comprises:
   receiving an externally supplied AC voltage and to generate a DC bus voltage therefrom using the rectifier circuit portion;
   receiving the DC bus voltage and generating an AC output voltage therefrom using the inverter circuit portion;
   supplying the AC output voltage to an external load;
   varying the resonant frequency of the notch frequency;
   modulating a supply current provided by the inverter circuit portion with a probe current signal at the resonant frequency;
   varying the resonant frequency to a plurality of values across an operational range;
   measuring an amplitude of the filtered signal;
   determining which of the plurality of values of the resonant frequency has a maximal amplitude of the filtered signal associated therewith; and
   determining a capacitance value of the DC link capacitor from said value of the resonant frequency associated with the maximal amplitude.

15. The motor drive as claimed in claim 1, wherein the controller is arranged to store the determined capacitance value in the memory and/or to retrieve the stored capacitance value from memory.

* * * * *